United States Patent
Dietrich et al.

(10) Patent No.: US 7,792,037 B2
(45) Date of Patent: Sep. 7, 2010

(54) INTEGRATED CIRCUIT INCLUDING DATA SYNCHRONIZATION APPARATUS AND METHOD

(75) Inventors: Stefan Dietrich, Tuerkenfeld (DE); Rex Kho, Holzkirchen (DE)

(73) Assignee: Qimonda AG, Munich (DE)

( * ) Notice: Subject to any disclaimer, the term of this patent is extended or adjusted under 35 U.S.C. 154(b) by 343 days.

(21) Appl. No.: 11/924,031

(22) Filed: Oct. 25, 2007

(65) Prior Publication Data

US 2008/0101238 A1     May 1, 2008

(30) Foreign Application Priority Data

Oct. 25, 2006   (DE) .............. 10 2006 050 362

(51) Int. Cl.
*G08C 15/00*  (2006.01)

(52) U.S. Cl. ............. 370/235; 370/463; 370/503; 710/22; 710/71; 710/305; 711/100; 711/167

(58) Field of Classification Search ............. None
See application file for complete search history.

(56) References Cited

U.S. PATENT DOCUMENTS

| RE37,753 E | * | 6/2002 | Kyung | ............. 365/233.1 |
| 7,443,761 B2 | * | 10/2008 | Lin | ............. 365/233.1 |
| 2003/0218933 A1 | * | 11/2003 | Schneider et al. | ......... 365/233 |

FOREIGN PATENT DOCUMENTS

| DE | 102 20 559 | 11/2002 |
| DE | 10 2006 032 131 | 1/2007 |
| KR | 10-0615580 | 8/2006 |

* cited by examiner

*Primary Examiner*—Chi H. Pham
*Assistant Examiner*—Shick Hom
(74) *Attorney, Agent, or Firm*—Dicke, Billig & Czaja, PLLC

(57) ABSTRACT

A synchronization apparatus for data synchronization and method for data synchronization is disclosed. One embodiment provides clock signals which are phase-shifted relative to one another are used for synchronizing data packets in a serial-to-parallel conversion device in a write path and equally for synchronizing data packets in a parallel-to-serial conversion device in a read path.

19 Claims, 6 Drawing Sheets

INTEGRATED CIRCUIT INCLUDING DATA SYNCHRONIZATION APPARATUS AND METHOD

CROSS-REFERENCE TO RELATED APPLICATIONS

This Utility Patent Application claims priority to German Patent Application No. DE 10 2006 050 362.7 filed on Oct. 25, 2006, which is incorporated herein by reference.

BACKGROUND

The invention relates to a synchronization apparatus and to a method for data synchronization.

Increasing data transmission rates is a fundamental aim of development for semiconductor apparatuses such as DRAMs (Dynamic Random Access Memories). Besides increasing clock rates, transmitting a plurality of data packets per clock cycle is also an option for increasing the data transmission speed. In a DDR-DRAM (Double Data Rate DRAM), for example, it is possible to transmit two data packets per clock cycle which are respectively synchronized to the rising and falling edges of the clock cycle.

It would be desirable to have a synchronization apparatus and a method for data synchronization which allow improved data transmission rates.

SUMMARY

One embodiment provides a synchronization apparatus for data synchronization. Clock signals that are phase-shifted relative to one another are used for synchronizing data packets in a serial-to-parallel conversion device in a write path and equally for synchronizing data packets in a parallel-to-serial conversion device in a read path.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

DETAILED DESCRIPTION

Figure 1:
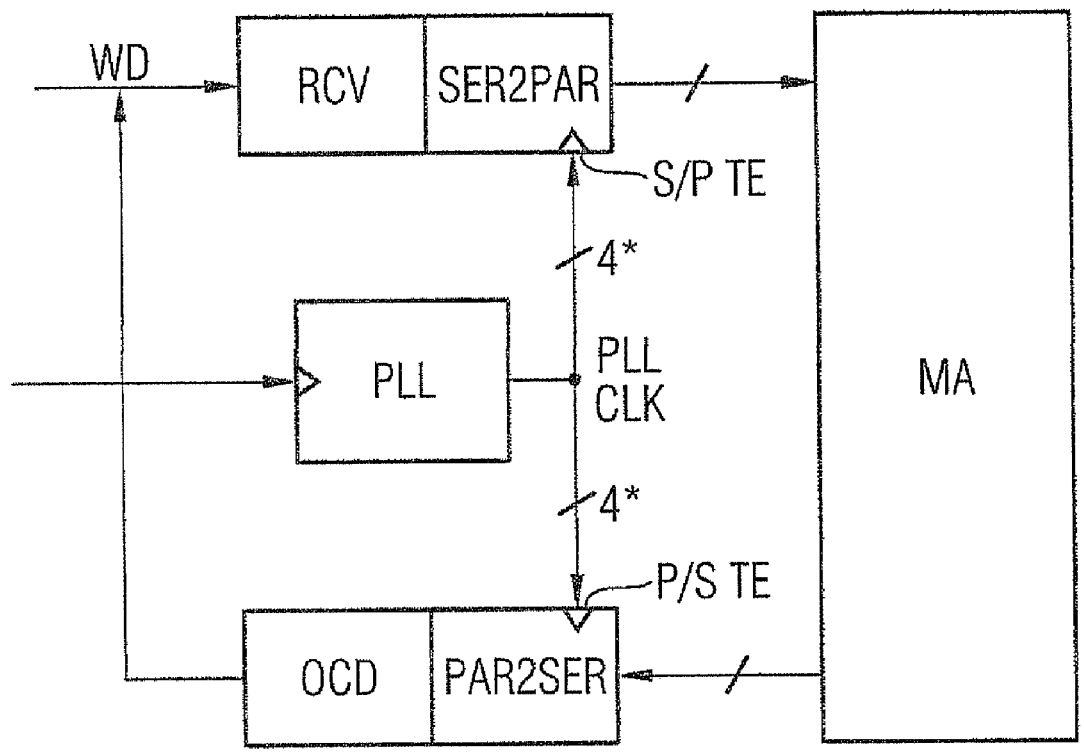
FIG. 1 illustrates a schematic illustration of a synchronization apparatus based on an embodiment.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

One embodiment relates to a synchronization apparatus having a serial-to-parallel conversion device which has a serial data input and a parallel data output, the parallel data output being connected to a parallel data input of a memory array, and which additionally has a parallel S/P clock input for receiving a plurality of clock signals which are phase-shifted relative to one another, a parallel-to-serial conversion device which has a parallel data input and a serial data output, the parallel data input being connected to a parallel data output of the memory array, and which additionally has a parallel P/S clock input for receiving the plurality of clock signals which are phase-shifted relative to one another. Equally, this embodiment has a PLL having a clock input and a parallel clock output for producing and outputting the plurality of clock signals which are phase-shifted relative to one another via the parallel clock output, the parallel clock output being connected to the serial-to-parallel conversion device and to the parallel-to-serial conversion device.

Accordingly, the phase-shifted clock signals used in the serial-to-parallel conversion device in a write path are also used in the parallel-to-serial conversion device in a read path. The number of the plurality of clock signals which are phase-shifted relative to one another can be used to control the number of the data packets which are to be synchronized per clock cycle, for example. The PLL's reference clock signal may be a Forward Clock clock signal, for example, which is used for data synchronization in the fifth-generation Graphics Double Data Rate standard (GDDR5), for example.

In another embodiment, the PLL takes a reference clock signal and produces four clock signals which are phase-shifted through 0°, 90°, 180° and 270° relative to the reference clock signal. These four phase-shifted clock signals can now be used firstly to synchronize four data packets within a clock cycle both in the serial-to-parallel conversion device in the write path and in the parallel-to-serial conversion device in the read path.

In another embodiment, the serial-to-parallel conversion device and the parallel-to-serial conversion device respectively have a plurality of flip-flops in which a respective data packet is synchronized using one of the phase-shifted clock signals. The data packet may therefore be one of the data packets read in parallel from the memory array in a read operation or else may be one of the data packets to be written in parallel to the memory array during a write operation.

In another embodiment, the memory array has a plurality of associated PLLs. If, by way of example, 32 bits are written to the memory array or read in parallel then in this regard it is possible to use four PLLs, for example, which actuate corresponding serial-to-parallel and parallel-to-serial conversion devices, each of these PLLs respectively being used to synchronize one byte per storage operation. It goes without saying that a different division into PLLs and conversion devices is also possible.

A synchronization apparatus based on a fourth embodiment additionally includes a write FIFO for clock domain conversion of write data signals, a latency counter FIFO for clock domain conversion of read signals with simultaneous shifting through a particular number of clock cycles, and a common counter device which is actuated using a clock signal from a first clock domain and which is used for actuating both an input pointer input of the write FIFO and an output pointer input of the latency counter FIFO.

The shift through a particular number of clock cycles in the latency counter FIFO is used to take account of a latency. The write FIFO is used to convert write data from a first clock domain, e.g., the Forward Clock clock domain, to a second clock domain, such as a system clock domain of the memory array. Equally, the latency counter FIFO is used to convert a read signal in the second clock domain to an Output Enable signal for a data path in the first clock domain.

By virtue of both the input pointer input of the write FIFO and the output pointer input of the latency counter FIFO being actuated by using the common counter device, it is possible to prevent an input pointer signal for the write FIFO and an output pointer signal for the latency counter FIFO from being in different unknown states following initialization, different unknown states of this kind, for example with separate counter devices for write FIFO and latency counter FIFO, coming to light if one of these paths looses a clock cycle but the other does not. It is therefore possible to prevent separate training operations for correcting such states from having to be carried out both in the write path and in the read path.

In another embodiment, the write FIFO has an output pointer input which is actuated by an output pointer device, actuated by using a clock signal from a second domain, using an output pointer signal, and the latency counter FIFO has an input pointer input which is actuated by an input pointer device, actuated by using the clock signal from the second domain, using an input pointer signal. The write FIFO is therefore supplied with an input pointer signal in the first clock domain and with an output pointer signal in the second clock domain. The latency counter FIFO is actuated using an input pointer signal in the second clock domain and using an output pointer signal in the first clock domain. The clock domains of the input pointer and the output pointer are therefore the opposite of those of the write FIFO and the latency counter FIFO, which can be attributed to the write operation firstly involving data needing to be transported from the write path to the memory array and the read operation involving data needing to be transported from the memory array to the read path, and the first clock domain being used for synchronization in the read and write paths and the second clock domain being used for synchronization in the memory array.

In another embodiment of the synchronization apparatus, the common counter device is connected to a decoder associated with the write FIFO and to a decoder associated with the latency counter FIFO for the purpose of actuating the decoders using an appropriate counter output signal, and each of the decoders is connected to the respective associated FIFO in order to supply the latter with a pointer signal decoded from the respective counter output signal. The pointer signals of the write FIFO and the latency counter FIFO may differ in terms of their width, for example, so that, by way of example, the output pointer signal for the latency counter FIFO is made up of a larger number of parallel-transmitted signals than the input pointer signal for the write FIFO. Correspondingly, a number of counter bits to be decoded by the decoder may also differ. It goes without saying that it is also possible to implement configurations in which the widths of the pointer signals for the write FIFO and the latency counter FIFO match.

A synchronization apparatus based on another embodiment additionally includes a first counter shift device having a training signal input, the first counter shift device prompting a shift in the output pointer signal for the write FIFO in a first direction, and it likewise includes a second counter shift device having a training signal input, the second counter shift device prompting a shift in the input pointer signal for the latency counter FIFO in a second direction opposite to the first direction. Accordingly, a training sequence involves a pointer shift to the pointer signals in the second clock domain, i.e. the output pointer signal for the write FIFO and the input pointer signal for the latency counter FIFO. This allows an equally acting pointer shift, i.e. reciprocal approach or departure, to be achieved for the write FIFO and the latency counter FIFO. If the aim is to reduce an interval between the input counter and the output counter of the FIFOs, for example, this is achieved in line with the above embodiment by shifting the output pointer signal for the write FIFO in the first direction toward the input pointer signal of the jointly used counter device and shifting the input pointer signal for the latency counter FIFO in the second direction, which is the opposite of this, toward the output pointer signal of the jointly used counter device. In this case, the interval between the input pointer and the output pointer is shortened in both FIFOs.

In another embodiment, the first and/or second counter shift device is/are contained in the respective associated counter device.

In another embodiment, the first counter shift device prompts suppression of one or more counting operations in the output counter device for the write FIFO, and the second counter shift device prompts an increase by one or more counting operations in the input counter device for the latency counter FIFO, or vice versa. This makes it possible to achieve, as described above, a common reduction or increase in the interval between the pointers in the write FIFO and in the latency counter FIFO.

For suppressing one or more counting operations, another embodiment provides a clock gate as a counter shift device.

Another embodiment of a method for data synchronization includes: production of a plurality of phase-shifted clock signals, output of the plurality of phase-shifted clock signals both to a serial-to-parallel conversion device in a write path and to a parallel-to-serial conversion device in a read path, synchronization of serial write data packets which are to be written using the phase-shifted clock signals in the serial-to-parallel synchronization device, and output thereof to a memory array in the form of parallel write data packets, and synchronization of parallel read data packets which have been read from the memory array using the phase-shifted clock signals in the parallel-to-serial synchronization device, and output thereof in the form of serial read data packets.

In another embodiment of the method for data synchronization, a PLL takes a reference clock signal and produces four clock signals which are phase-shifted through 0°, 90°, 180° and 270° relative to the reference clock signal. These four phase-shifted clock signals can be used for synchronizing four data packets within a clock cycle, for example, and are therefore suitable for data transmission for the 5th generation of the Graphics Double Data Rate standard.

In another embodiment of the data synchronization method, the read data packets which have been read and the write data packets which are to be written are synchronized using the phase-shifted clock signals in flip-flops in the respective conversion device.

In another embodiment of the data synchronization method, clock domain conversion of the write data packets which are to be written takes place in a write FIFO, and clock domain conversion of read data which have been read takes place in a latency counter FIFO, where a common counter device is used to actuate both the write FIFO using an output pointer signal and the latency counter FIFO using an input pointer signal.

In another embodiment, a counter output signal from the common counter device, which signal is associated with the write FIFO, is converted into the input pointer signal for the write FIFO by using a decoder associated with the write FIFO, and a counter output signal from the common counter device, which signal is associated with the latency counter FIFO, is converted into the output pointer signal for the latency counter FIFO by using a decoder associated with the latency counter FIFO.

Another embodiment specifies a data synchronization method in which the output pointer signal for the write FIFO is shifted in a first direction by a first counter shift device on the basis of a training signal, and the input pointer signal for the latency counter FIFO is shifted a second time in a second direction opposite to the first direction by a second counter shift device on the basis of a training signal. The training signals for the two counter shift devices can be implemented both in the form of different signals and by using a common training signal.

In another embodiment, the first and/or second counter shift device is/are integrated in the respective associated counter device.

Another embodiment specifies a data synchronization method in which the first counter shift device prompts suppression of one or more counting operations in the output counter device for the write FIFO, and the second counter shift device prompts an increase by one or more counting operations in the input counter device for the latency counter FIFO, or vice versa.

One or more counting operations in another embodiment for data synchronization can be suppressed using a clock gate.

FIG. 1 illustrates a schematic view of a synchronization apparatus based on an embodiment. In this arrangement, a receiver RCV in a write data path is supplied with write data WD which are to be stored in a memory array MA. The write data WD are amplified by the receiver RCV and are supplied to a serial-to-parallel conversion device SER2PAR. The latter synchronizes the data packets using a suitable plurality of phase-shifted clock signals, which are denoted by PLLCLK for simplicity. The phase-shifted clock signals PLLCLK are produced and output by a PLL (Phase Locked Loop). In the embodiment illustrated in FIG. 1, by way of example, four clock signals PLLCLK which are phase-shifted relative to one another are produced and are supplied to the serial-to-parallel conversion device SER2PAR in parallel via a serial/parallel clock input S/P TE. The serial-to-parallel conversion device transfers the write data to the memory array MA in parallel. The embodiment uses the phase-shifted clock signals PLLCLK used in the write path in a read path too, in order to synchronize the read data supplied to a parallel-to-serial conversion device PAR2SER from the memory array MA in parallel and to output them in the form of a serial data stream via an off-chip driver OCD. The phase-shifted clock signals PLLCLK are supplied to the parallel-to-serial conversion device via a parallel/serial clock input P/S TE. Hence, the phase-shifted clock signals used for synchronization in the write path are also used for synchronization of the data in the read path. The PLL uses a reference clock signal to produce the phase-shifted clock signals. In the exemplary embodiment illustrated, it is therefore possible to synchronize four data packets within a clock cycle in both the read path and the write path. It goes without saying that it is possible to implement other embodiments with a number of phase-shifted clock signals which is different than four, so that the number of four phase-shifted clock signals which is used in this example can be considered merely as an example, but in no way as limiting. Equally, both the rising and falling clock edges can be used for synchronization, so that two data packets per clock cycle can be synchronized per phase-shifted clock signal.

Figure 2:
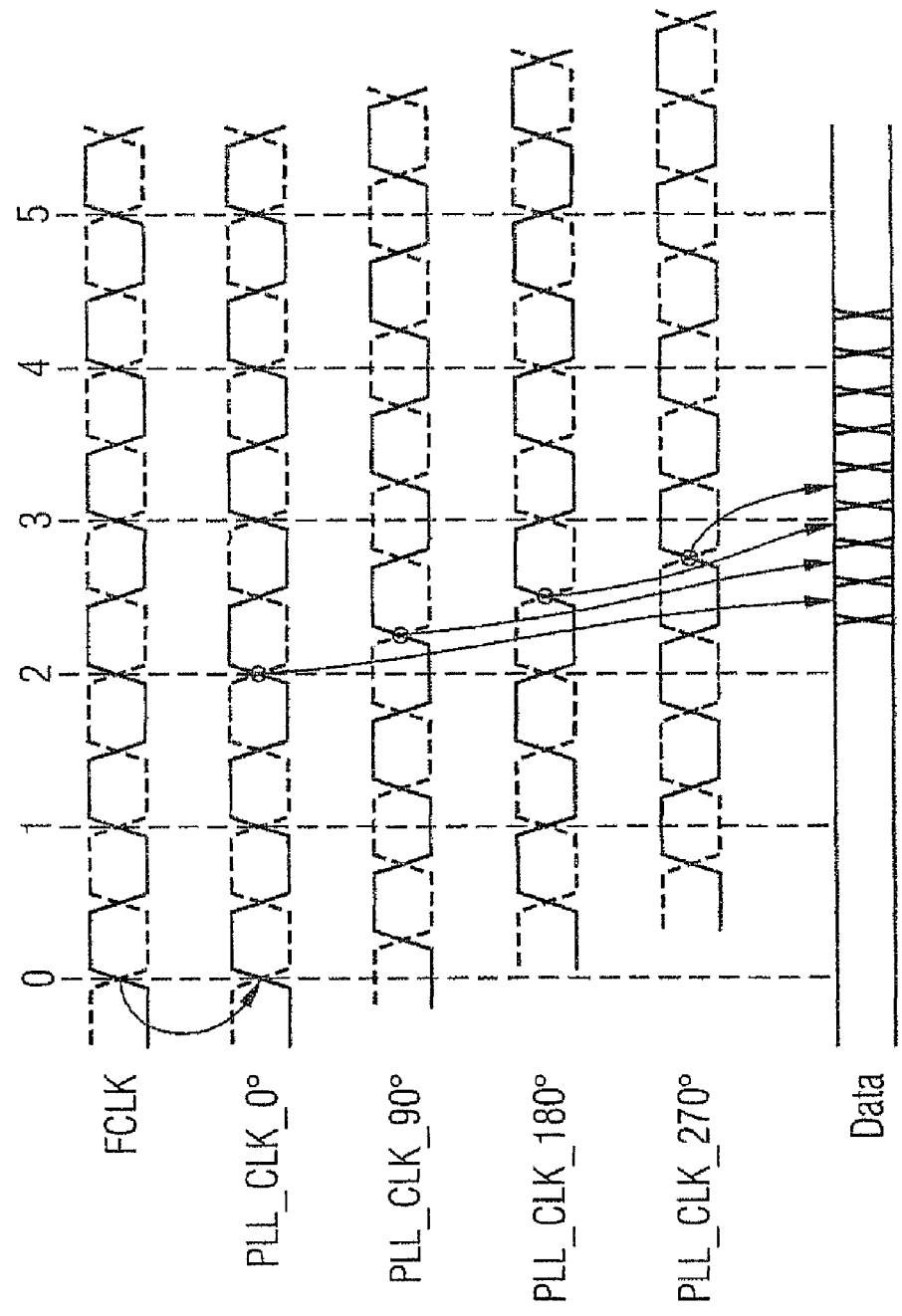
FIG. 2 illustrates a schematic illustration for data synchronization using the embodiment illustrated in FIG. 1.

FIG. 2 illustrates a schematic diagram for the synchronization of read data packets using the phase-shifted clock signals PLLCLK in the read path. The read clock signal used for the PLL is a Forward Clock clock signal FCLK, for which the PLL derives four phase-shifted clock signals PLL_CLK_0°, PLL_CLK_90°, PLL_CLK_180°, PLL_CLK_270° whose rising clock edge is used to synchronize the data packets in a data string Data. The synchronization of the data packets using an appropriately associated phase-shifted clock signal PLLCLK is illustrated schematically by using arrows. The four phase-shifted clock signals can be used to synchronize four data packets within a clock cycle. As already mentioned above, it is also possible to use two clock signals which are phase-shifted relative to one another in order to synchronize four data packets in a clock cycle by utilizing both the rising and the falling clock edge. When utilizing the rising and the falling clock edge for data synchronization, the number of phase-shifted clock signals to be produced can be halved in comparison with synchronization using exclusively rising or falling clock edges. Other embodiments can therefore also use falling and also rising and falling clock edges of clock signals phase-shifted relative to one another for data synchronization.

Figure 3:
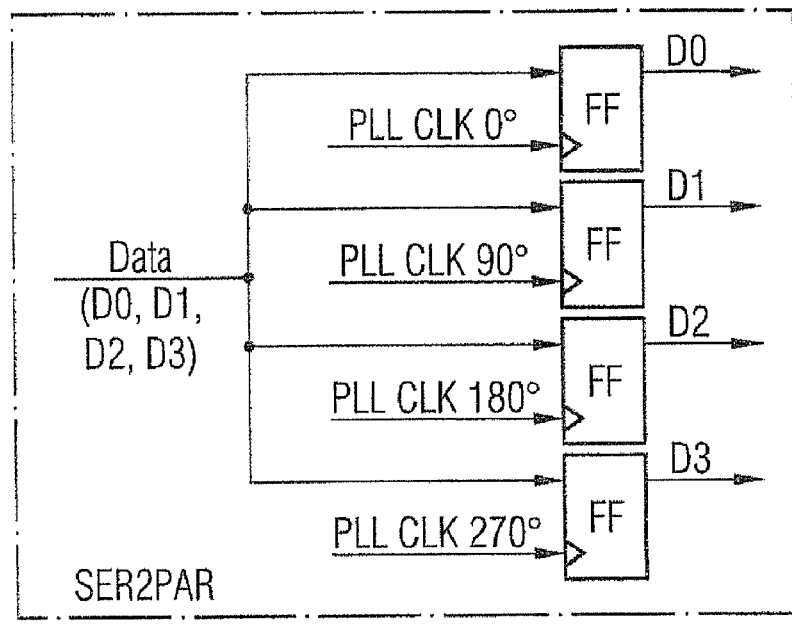
FIG. 3 illustrates a schematic view of a serial-to-parallel conversion device based on another embodiment.

FIG. 3 illustrates a schematic view of a serial-to-parallel conversion device SER2PAR based on an embodiment. The embodiment is again based on the four phase-shifted clock signals above. It goes without saying that the serial-to-parallel conversion device can be implemented using a different number of clock signals than this. Serially incoming data packets D0, D1, D2, D3 in the data string Data are latched in different flip-flops FF using the phase-shifted clock signals PLL_CLK_0°, PLL_CLK 90°, PLL_CLK_180° and PLL_CLK_270° and are then output to the memory array MA in parallel (see also FIG. 1).

Figure 4:
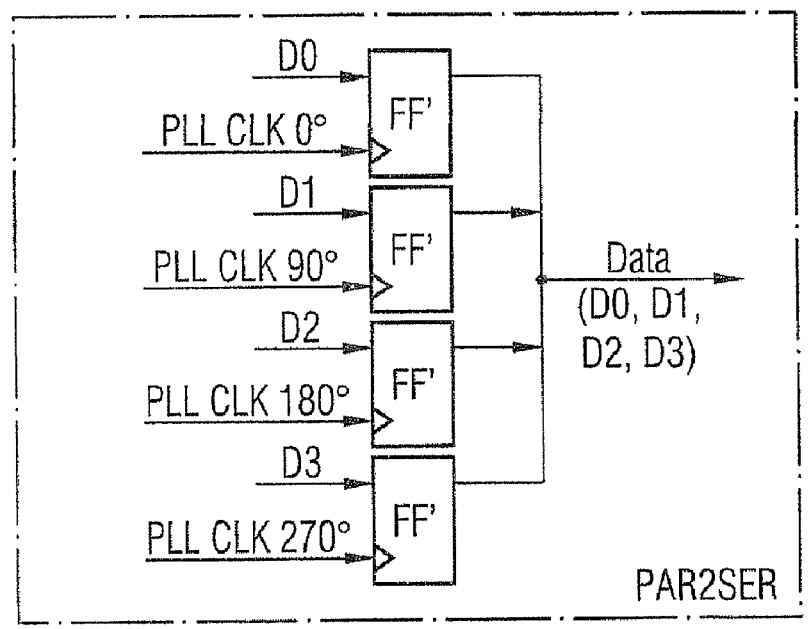
FIG. 4 illustrates a schematic view of a parallel-to-serial conversion device based on another embodiment.

FIG. 4 illustrates a schematic illustration of a parallel-to-serial conversion device PAR2SER based on another embodiment. The parallel-to-serial conversion device PAR2SER works in the opposite order to the serial-to-parallel conversion device SER2PAR illustrated in FIG. 3. In this case, the data packets D0, D1, D2 and D3 are read from the memory array MA in parallel, are latched in the flip-flops FF' and are synchronized using the phase-shifted clock signals PLL_CLK_0°, PLL_CLK_90°, PLL_CLK_180° and PLL_CLK_270°, and are output as a data string in the form of serial data packets D0, D1, D2 and D3.

Figure 5:
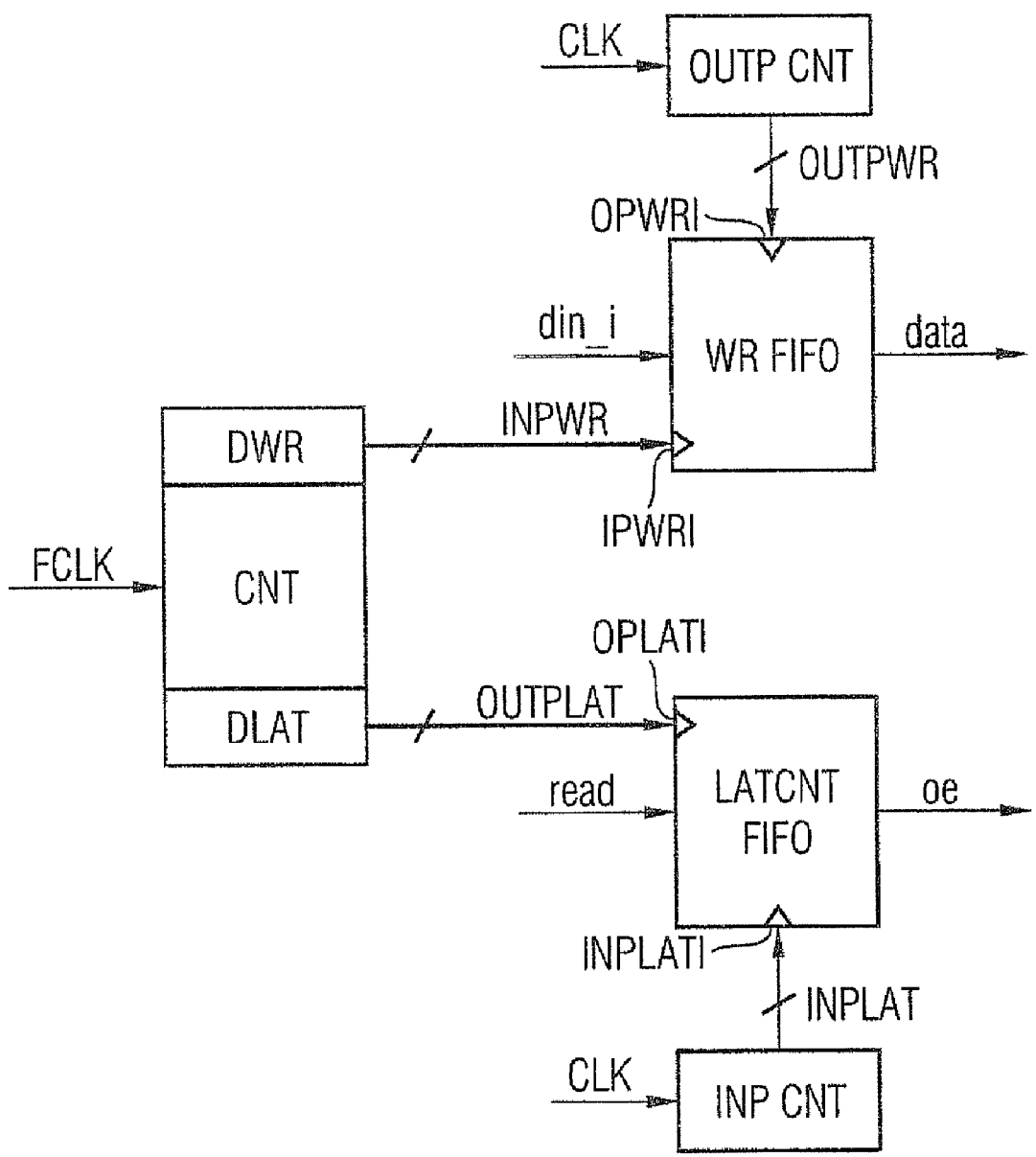
FIG. 5 illustrates a schematic view of a synchronization apparatus based on another embodiment.
Figure 6A:
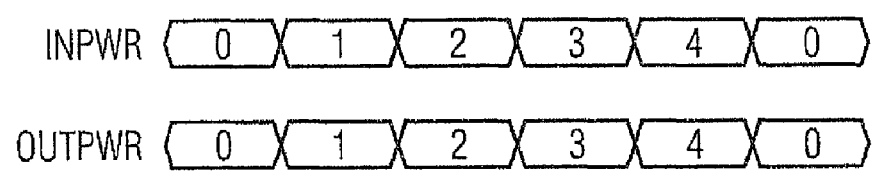
FIGS. 6A-6D illustrate schematic views for counter shifting based on an embodiment of a data synchronization method.
Figure 6B:
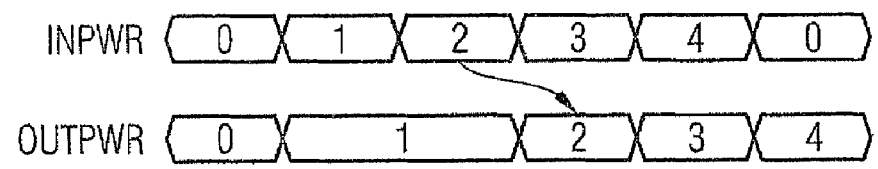
Figure 6C:
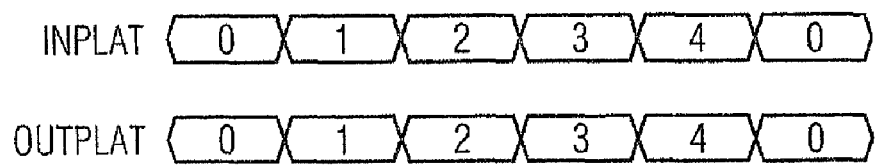
Figure 6D:
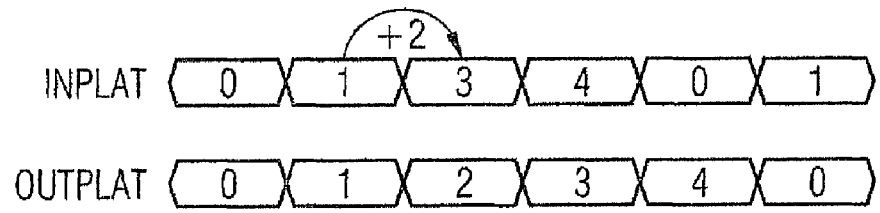

FIG. 5 illustrates another embodiment of a synchronization apparatus. To assist in understanding this embodiment, it will first of all be noted that the synchronization apparatus processes clock signals from two different clock domains. These are firstly the Forward Clock clock signal FCLK and secondly a system clock signal CLK. Both when writing and when reading data, the data need to be converted from one to the other clock domain. If an offset between the two clock signals FCLK and CLK, which is usually referred to as $t_{DQSS}$, is able to be more than half a clock cycle then edges can be situated exactly above one another, which can result in clock cycle losses. Such clock cycle losses on account of clock domain conversion are usually counteracted using what is known as training, which corrects these states. The further embodiment of a synchronization apparatus which is based on the embodiment from FIG. 1 and is illustrated in FIG. 5 allows system performance for joint training in the write and read paths.

In the write path, a write FIFO, WR FIFO, is used for transmitting data din_i from the clock domain of the Forward Clock clock signal to data (data) from the clock domain of the system clock signal CLK. The write FIFO, WR FIFO, has an output pointer input OPWRI which is actuated by an output counter device OUTP CNT, actuated by using a clock signal from the clock domain of the system clock CLK, using an output pointer signal OUTPWR. Equally, the write FIFO, WR FIFO, has an input pointer input IPWRI which is actuated using an input pointer signal INPWR.

Similarly, a latency counter FIFO, LATCNT FIFO, is used in the read path in order to convert an internal read signal (read) from the clock domain of the system clock CLK to an Output Enable signal OE from the clock domain of the Forward Clock clock FCLK for the read path with a simultaneous shift by a defined number of clock cycles. The latency counter FIFO, LATCNT FIFO, has an input pointer input INPLATI which is actuated by an input counter device INP CNT, actuated by using the system clock CLK, using an input pointer signal INPLAT. Equally, the latency counter FIFO, LATCNT FIFO, has an output pointer input OPLATI which is used to supply an output pointer signal OUTPLAT from the clock domain of the Forward Clock clock signal. Both the output pointer signal OUTPLAT for the latency counter FIFO, LATCNT FIFO, and the input pointer signal INPWR for the write FIFO, which are both in the clock domain of the Forward Clock clock signal FCLK, come from a jointly used counter device CNT which is actuated by using the Forward Clock clock signal FCLK. The write FIFO, WR FIFO, and the jointly used counter device CNT have an associated decoder DWR which converts an appropriate counter output signal from the jointly used counter device CNT to the input counter signal INPWR for the write FIFO, WR FIFO. Equally, the latency counter FIFO, LATCNT FIFO, and the jointly used counter device CNT have an interposed decoder DLAT which converts a counter output signal from the jointly used counter device CNT to the output pointer signal OUTPLAT for the latency counter FIFO, LATCNT FIFO.

Hence, the synchronization apparatus in this embodiment uses a common counter device CNT for tasks in the write and read paths.

FIG. 6 illustrates a schematic illustration of an embodiment of a data synchronization method, the discussion here involving a training process for finding a correct orientation between input and output pointers in the write FIFO, WR FIFO, and in the latency counter FIFO, LATCNT FIFO. This training is carried out at the start of memory operation in order to put the pointers of the FIFOs into a defined state on the basis of the possible variations of $t_{DQSS}$ already described in connection with FIG. 5. Since a pointer shift for the jointly used counter device CNT would result in an equidirectional shift in the input counter INPWR for the write FIFO, WR FIFO, and in the output pointer OUTPLAT for the latency counter FIFO, LATCNT FIFO, i.e. would result in an increase in the pointer interval in one FIFO and in a reduction in the pointer interval in the other FIFO, the training operation in this embodiment prompts a shift in the output pointer signal OUTPWR for the write FIFO, WR FIFO, in a first direction and a shift in the input pointer signal INPLAT for the latency counter FIFO, LATCNT FIFO, in a second direction, which is the opposite of the first direction. First of all, Figure parts a) and b) will be used to explain a pointer shift in the output pointer OUTPWR. In this case, the output pointer OUTPWR is decremented by a counting operation in the training process illustrated in FIG. 6b, which is achieved in this case by suppressing a counting operation. The shift is identified schematically by using an arrow.

Figure parts c) and d) will be used to explain a shift in the input pointer INPLAT for the latency counter FIFO, LATCNT FIFO, which is opposite the shift in the output pointer OUTPWR for the write FIFO, WR FIFO. In this case, the input pointer INPLAT is incremented by two counting operations in the training process illustrated in FIG. 6d. In comparison with the initial state of INPLAT in FIG. 6c, this achieves an opposite shift with respect to the shift in OUTPWR in FIG. 6b. The result of this is that an interval between the input pointer and the output pointer in the two FIFOs, i.e. the write FIFO, WR FIFO, and the latency counter FIFO, LATCNT FIFO, is altered in the same direction, i.e. a common reduction or increase takes place.

Figure 7:
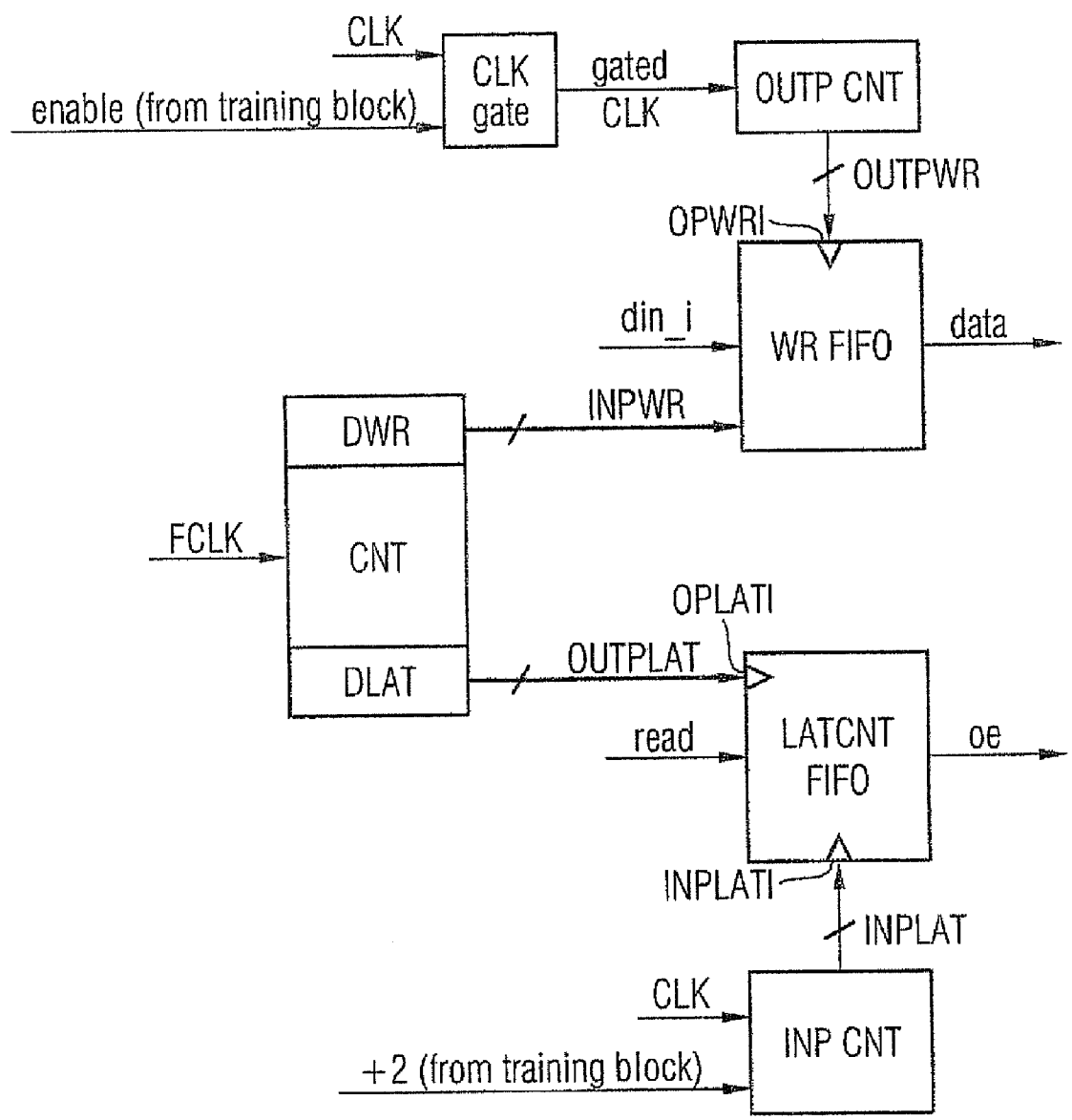
FIG. 7 illustrates a schematic view of a synchronization apparatus based on another embodiment.

FIG. 7 illustrates a schematic illustration of a synchronization apparatus in another embodiment which can be used to carry out the training explained in FIG. 6. Fundamental parts of the synchronization apparatus illustrated in FIG. 7 correspond to those of the synchronization apparatus illustrated in FIG. 5, so that the text below discusses only the components which go beyond that. Thus, the output counter device OUTP CNT for the write FIFO, WR FIFO, has a clock gate CLK Gate connected upstream of it which can intermittently mask out the incoming system clock signal CLK. This is controlled by a training signal (enable) which is produced by a training block (not illustrated). This allows individual counting of the output counter device OUTPCNT to be suppressed, which results in the counter shift illustrated in FIG. 6b. In the case of the latency counter FIFO, LATCNT FIFO, the input counter signal INPLAT is produced by the input counter device INP CNT, which is likewise actuated by using the system clock signal CLK. This counter device is distinguished in that incrementation by +1 in normal mode or by +2 in training mode can be carried out on the basis of the training signal +2. The incrementation by +2 counting operations is illustrated schematically in FIGS. 6c-6d. The training signal +2 is likewise produced by the training block and can occur together with the Output Enable signal OE.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A synchronization apparatus comprising:
a serial-to-parallel conversion device having a serial data input and a parallel data output, the parallel data output being connected to a parallel data input of a memory array, and additionally having a parallel S/P clock input for receiving a plurality of clock signals which are phase-shifted relative to one another;
a parallel-to-serial conversion device having a parallel data input and a serial data output, the parallel data input being connected to a parallel data output of the memory array, and additionally having a parallel P/S clock input for receiving the plurality of clock signals which are phase-shifted relative to one another;

a PLL having a clock input and a parallel clock output for producing and outputting the plurality of clock signals which are phase-shifted relative to one another via the parallel clock output, the parallel clock output being connected to the serial-to-parallel conversion device and to the parallel-to-serial conversion device;

a write FIFO for clock domain conversion of write data signals;

a latency counter FIFO for clock domain conversion of read signals with simultaneous shifting through a particular number of clock cycles: and a common counter device which is actuated using a clock signal from a first domain and which is used for actuating both an input pointer input of the write FIFO and an output pointer input of the latency counter FIFO.

2. The synchronization apparatus of claim 1, comprising: the PLL taking a reference clock signal; and producing four clock signals which are phase-shifted through 0°, 90°, 180° and 270° relative to the reference clock signal.

3. The synchronization device of claim 1, wherein the serial-to-parallel conversion device and the parallel-to-serial conversion device respectively have a plurality of flip-flops in which a respective data packet is synchronized using one of the phase-shifted clock signals.

4. The synchronization apparatus of claim 1, comprising wherein the memory array has a plurality of associated PLLs.

5. The synchronization apparatus of claim 1, wherein the write FIFO has an output pointer input which is actuated by an output pointer device, actuated by using a clock signal from a second domain, using an output pointer signal; and the latency counter FIFO has an input pointer input which is actuated by an input pointer device, actuated by using the clock signal from the second domain, using an input pointer signal.

6. The synchronization apparatus of claim 1, comprising wherein the common counter device is connected to a decoder associated with the write FIFO and to a decoder associated with the latency counter FIFO for the purpose of actuating the decoders using an appropriate counter output signal; and each of the decoders is connected to the respective associated FIFO in order to supply the latter with a pointer signal decoded from the respective counter output signal.

7. The synchronization apparatus of claim 1, comprising:
a first counter shift device having a training signal input, the first counter shift device prompting a shift in the output pointer signal for the write FIFO in a first direction; and a second counter shift device having a training signal input (+2), the second counter shift device prompting a shift in the input pointer signal for the latency counter FIFO in a second direction opposite to the first direction.

8. The synchronization apparatus of claim 7, wherein the first and/or second counter shift device is/are contained in the respective associated counter device.

9. The synchronization apparatus of claim 7, wherein the first counter shift device prompts suppression of one or more counting operations in the output counter device for the write FIFO, and the second counter shift device prompts an increase by one or more counting operations in the input counter device for the latency counter FIFO, or vice versa.

10. The synchronization apparatus of claim 9, wherein a clock gate is provided as a counter shift device for suppressing one or more counting operations.

11. A method for data synchronization, comprising:
producing a plurality of phase-shifted clock signals;
outputting the plurality of phase-shifted clock signals both to a serial-to-parallel conversion device in a write path and to a parallel-to-serial conversion device in a read path;

synchronizing serial write data packets that are to be written using the phase-shifted clock signals in the serial-to-parallel synchronization device, and outputting thereof to a memory array in the form of parallel write data packets;

synchronizing parallel read data packets that have been read from the memory array using the phase-shifted clock signals in the parallel-to-serial synchronization device, and outputting thereof in the form of serial read data packets;

wherein clock domain conversion of the write data packets to be written takes place in a write FIFO, and clock domain conversion of read data having been read takes place in a latency counter FIFO; and a common counter device is used to actuate both the write FIFO using an output pointer signal and the latency counter FIFO using an input pointer signal.

12. The method of claim 11, comprising a PLL taking a reference clock signal and producing four clock signals which are phase-shifted through 0°, 90°, 180° and 270° relative to the reference clock signal.

13. The method of claim 11, comprising synchronizing the read data packets which have been read and the write data packets which are to be written using the phase-shifted clock signals in flip-flops in the respective conversion device.

14. The method of claim 11 comprising:
converting a counter output signal from the common counter device, which signal is associated with the write FIFO, into the input pointer signal for the write FIFO by using a decoder associated with the write FIFO; and converting a counter output signal from the common counter device, which signal is associated with the latency counter FIFO, into the output pointer signal for the latency counter FIFO by using a decoder associated with the latency counter FIFO.

15. The method of claim 11 comprising:
shifting the output pointer signal for the write FIFO in a first direction by a first counter shift device on the basis of a training signal (enable); and shifting the input pointer signal for the latency counter FIFO in a second direction opposite to the first direction by a second counter shift device on the basis of a training signal.

16. The method of claim 15, comprising integrating the first and/or second counter shift device in the respective associated counter device.

17. The method of claim 15, wherein the first counter shift device prompts suppression of one or more counting operations in the output counter device for the write FIFO, and the second counter shift device prompts an increase by one or more counting operations in the input counter device for the latency counter FIFO, or vice versa.

18. The method of claim 17, comprising using a clock gate to suppress one or more counting operations.

19. A synchronization apparatus comprising:
a serial-to-parallel conversion device which has a serial data input and a parallel data output, the parallel data output being connected to a parallel data input of a memory array, and which additionally has a parallel S/P clock input for receiving a plurality of clock signals which are phase-shifted relative to one another;

a parallel-to-serial conversion device which has a parallel data input and a serial data output, the parallel data input being connected to a parallel data output of the memory array, and which additionally has a parallel P/S clock input for receiving the plurality of clock signals which are phase-shifted relative to one another;

means having a clock input and a parallel clock output for producing and outputting the plurality of clock signals which are phase-shifted relative to one another via the parallel clock output, the parallel clock output being connected to the serial-to-parallel conversion device and to the parallel-to-serial conversion device;

a write FIFO for clock domain conversion of write data signals;

a latency counter FIFO for clock domain conversion of read signals with simultaneous shifting through a particular number of clock cycles; and a common counter device which is actuated using a clock signal from a first domain and which is used for actuating both an input pointer input of the write FIFO and an output pointer input of the latency counter FIFO.

* * * * *